(12) United States Patent
Vian et al.

(10) Patent No.: US 9,846,199 B2
(45) Date of Patent: Dec. 19, 2017

(54) HEALTH MANAGEMENT OF RECHARGEABLE BATTERIES

(71) Applicant: The Boeing Company, Chicago, IL (US)

(72) Inventors: John L. Vian, Renton, WA (US); Ali R. Mansouri, Bothell, WA (US); Rangasamy Elangovan, Bothell, WA (US); Mori M. Borumand, Woodinville, WA (US); Khaled Abdel-Motagaly, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/518,792

(22) Filed: Oct. 20, 2014

(65) Prior Publication Data
US 2015/0100198 A1    Apr. 9, 2015

Related U.S. Application Data

(62) Division of application No. 11/565,574, filed on Nov. 30, 2006, now Pat. No. 8,890,480.

(51) Int. Cl.
*G01R 31/36*    (2006.01)
*B64D 45/00*    (2006.01)
(Continued)

(52) U.S. Cl.
CPC ......... *G01R 31/3624* (2013.01); *B64D 45/00* (2013.01); *G01R 31/3651* (2013.01);
(Continued)

(58) Field of Classification Search
CPC ............ G01R 31/3624; G01R 31/3693; G01R 31/3679; G01R 31/3651; G01R 31/008;
(Continued)

(56) References Cited

U.S. PATENT DOCUMENTS 4,968,942 A    11/1990 Palanisamy
5,130,659 A *  7/1992 Sloan ........................... 324/435
(Continued)

OTHER PUBLICATIONS

Bumby, J. et al., "Computer Modelling of the Automotive Energy Requirements for Internal Combustion Engine and Battery Electric-powered Vehicles", IEEE Proceedings Physical Science, Measurement and Instrumentation, Management and Education, Part A, vol. 132, Issue 5, Sep. 1985, pp. 265-279.
(Continued)

*Primary Examiner* — Rodney Butler
(74) *Attorney, Agent, or Firm* — Toler Law Group, PC

(57) ABSTRACT

A vehicle includes a body and at least one propulsion unit operatively coupled to the body. The vehicle also includes an electrical power system at least partially disposed within the body. The electrical power system includes a rechargeable battery and a health management unit operatively coupled to the rechargeable battery. The health management unit includes a state of health module configured to output information corresponding to battery health based on received battery-related data. The battery-related data includes data collected in real time operation of the rechargeable battery and battery relevant fault history of the vehicle.

20 Claims, 11 Drawing Sheets

(51) Int. Cl.
*H01M 10/42* (2006.01)
*H01M 10/48* (2006.01)
*H02J 7/00* (2006.01)
*G01R 31/00* (2006.01)

(52) U.S. Cl.
CPC ..... *G01R 31/3679* (2013.01); *G01R 31/3693* (2013.01); *H01M 10/425* (2013.01); *H01M 10/48* (2013.01); *H02J 7/0022* (2013.01); *H02J 7/0026* (2013.01); *H02J 7/0029* (2013.01); *G01R 31/008* (2013.01); *Y02E 60/12* (2013.01); *Y02T 10/7055* (2013.01)

(58) Field of Classification Search
CPC .... B64D 45/00; H01M 10/48; H01M 10/425; H02J 7/0022; H02J 7/0029; H02J 7/0026; Y02E 60/12
See application file for complete search history.

(56) References Cited

U.S. PATENT DOCUMENTS

| | | | |
|---|---|---|---|
| 5,623,197 A * | 4/1997 | Roseman et al. | 320/134 |
| 5,899,411 A * | 5/1999 | Latos et al. | 244/53 A |
| 5,912,548 A | 6/1999 | Downs et al. | |
| 6,329,792 B1 * | 12/2001 | Dunn et al. | 320/132 |
| 7,164,272 B1 * | 1/2007 | Borrego Bel et al. | 324/429 |
| 7,688,022 B2 * | 3/2010 | Alvarez-Troncoso et al. | 320/104 |
| 2003/0184307 A1 | 10/2003 | Kozlowski et al. | |
| 2005/0174092 A1 * | 8/2005 | Dougherty et al. | 320/128 |
| 2006/0126608 A1 | 6/2006 | Pereira et al. | |
| 2007/0029974 A1 * | 2/2007 | Uchida | 320/132 |
| 2007/0090844 A1 * | 4/2007 | Klang | 324/426 |
| 2007/0236225 A1 * | 10/2007 | Tsenter et al. | 324/426 |
| 2008/0071483 A1 * | 3/2008 | Eaves | 702/63 |
| 2008/0100135 A1 * | 5/2008 | Lazarovich et al. | 307/9.1 |
| 2009/0096424 A1 * | 4/2009 | Ambrosio et al. | 320/152 |
| 2010/0114512 A1 * | 5/2010 | Cotton et al. | 702/63 |
| 2010/0262404 A1 * | 10/2010 | Bertness | 702/183 |

OTHER PUBLICATIONS

Drouilhet, S. et al., "A Battery Life Prediction Method for Hybrid Power Applications", 35th AIAA Aerospace Sciences Meeting and Exhibit, Jan. 6-9, 1997, 16 pages.

Gibbs, D. et al., "Battery Life Prediction for VRLA Batteries", Department of Engineering and Physical Systems, Central Queensland University, 2005, 6 pages.

McDonald, A., "Reducing Battery Costs for Electric Vehicles through Optimal Depth of Discharge", EVC No. 8142, EVC Symposium VI, Baltimore, MD, Oct. 21-23, 1981, Electric Vehicle Counsel, Washington, DC, 9 pages.

Simpson, C., "Characteristics of Rechargeable Batteries", National Semiconductor White Paper, 1995, 10 pages.

* cited by examiner

HEALTH MANAGEMENT OF RECHARGEABLE BATTERIES

PRIORITY CLAIM

This application claims priority from, and is a divisional application of, U.S. patent application Ser. No. 11/565,574, filed on Nov. 30, 2006, which is incorporated herein by reference in its entirety.

FIELD OF THE DISCLOSURE

The present disclosure generally relates to rechargeable batteries, and more specifically, to systems and methods for health management of rechargeable batteries for aerospace applications, automotive applications, and other suitable applications.

BACKGROUND

There are significant cost and maintenance challenges associated with rechargeable batteries. These challenges may impose economic concerns in a wide variety of applications. For example, in aerospace applications, unexpected battery failures may present a considerable economic impact due to system interruptions, unscheduled flight delays and cancellations, loss of capabilities, and associated costs and logistical challenges.

Existing rechargeable battery systems for aircraft and other aerospace systems typically provide only a limited indication of battery voltage. Despite such existing voltage monitoring systems, unexpected failures of rechargeable battery systems continue to occur. Therefore, although desirable results have been achieved using prior art rechargeable battery systems, there is room for improvement.

SUMMARY

Embodiments of systems and methods for health management of rechargeable batteries in accordance with the present disclosure may advantageously provide improved monitoring, characterization, control, and status determination of the health status of rechargeable batteries, and may reduce unexpected battery failures, loss of capabilities, and associated costs and logistical challenges.

In one embodiment, a rechargeable battery system includes a rechargeable battery, and a battery health management unit operatively coupled to the rechargeable battery and including a state of health module configured to estimate a battery health by receiving battery-related data and predicting one or more failure modes. In another embodiment, the state of health module may include a prognostic failure mode component configured to combine at least one flight data variable with at least one model-based prognostic.

In alternate embodiments, the battery health management unit may further include a state of life module and a state of charge module. The state of life module may be configured to determine the remaining battery life based on a correlation between a model-based analysis and a battery-relevant data including at least one of a voltage, a temperature, a current, a charge cycle, an operating time, a shelf time, and an onboard time. The state of charge module may be configured to determine a remaining battery capacity based on a discharge rate, a reference capacity, and a reference discharge rate.

In another embodiment, a vehicle includes a fuselage, at least one propulsion unit operatively coupled to the fuselage, and an electrical power system at least partially disposed within the fuselage. The electrical power system includes a rechargeable battery, and a battery health management unit operatively coupled to the rechargeable battery and including a state of health module configured to estimate a battery health by receiving battery-related data and predicting one or more failure modes. In a further embodiment, the battery health management unit includes an on-vehicle portion and an off-vehicle portion.

In yet another embodiment, a method of determining a health characteristic of a rechargeable battery includes providing a state of health module coupled to the rechargeable battery, receiving a battery-related data into the state of health module, predicting one or more failure modes of the rechargeable battery using the battery-related data, and estimating a battery health based on the predicted one or more failure modes.

BRIEF DESCRIPTION OF THE DRAWINGS

Embodiments of the present disclosure are described in detail below with reference to the following drawings.

DETAILED DESCRIPTION

The present disclosure relates to systems and methods for health management of rechargeable batteries. Many specific details of certain embodiments of the disclosure are set forth in the following description and in FIGS. 1-15 to provide a thorough understanding of such embodiments. One skilled in the art, however, will understand that the present disclosure may have additional embodiments, or that the present disclosure may be practiced without several of the details described in the following description.

In general, embodiments of systems and methods for health management of rechargeable batteries may provide modular architectures that support both on-board and off-board software and hardware elements, and that may use a variety of battery parameters, such as current, voltage and temperature, along with battery performance and life cycle models, advanced signal processing algorithms, and diagnostic and prognostic reasoning algorithms. Embodiments of the disclosure can be implemented in virtually any rechargeable battery application, and may perform a variety of functions. For example, in some embodiments, systems and methods may estimate battery State Of Charge, and remaining battery life and capacity, referred to as State Of Life, and may also detect, predict, and isolate different failure modes, here referred to as the State Of Health. Thus, embodiments of the disclosure may provide improved battery control, and may also lead to increased battery safety.

Figure 1:
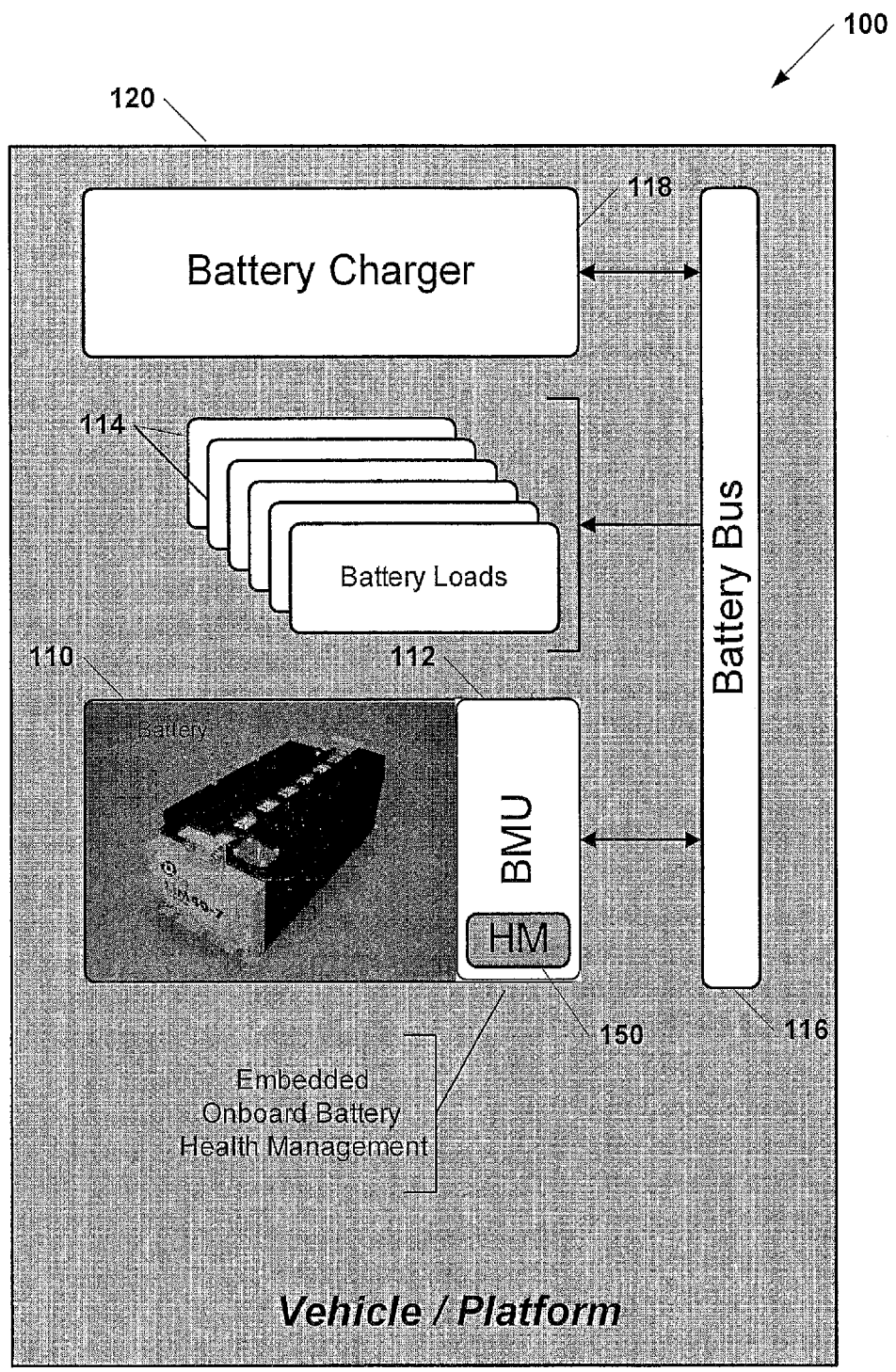
FIG. 1 is a rechargeable battery architecture having an embedded health management unit.

FIG. 1 is a rechargeable battery architecture 100 having an embedded health management solution 150. In this embodiment, the architecture 100 includes a rechargeable battery 110 that includes a battery monitoring unit 112. A plurality of battery loads 114 are coupled to the rechargeable battery 110 by a battery bus 116. A charger 118 is also coupled to the rechargeable battery 110 via the battery bus 116. As shown in FIG. 1, in this embodiment, the rechargeable battery 110, battery loads 112, charger 118, and battery bus 116 are disposed on a vehicle (or platform) 120. The vehicle 120 may be an aircraft, an unmanned aerial vehicle (UAV), an electric or hybrid automobile, a golf cart or personal conveyance, or any other suitable type of vehicle having one or more rechargeable batteries 110. In further embodiments, the platform 120 may be any type of moveable or stationary equipment having one or more rechargeable batteries 110.

In this embodiment, the rechargeable battery 110 includes a health management unit 150. The health management unit 150 may be disposed within the health monitoring unit 112, or within any other suitable portion of the rechargeable battery 110. In further embodiments, the health management unit 150 may be partially or completely separate from the rechargeable battery 110, and may be operatively coupled to the rechargeable battery 110 (e.g., via the battery bus 116), as described more fully below.

Figure 2:
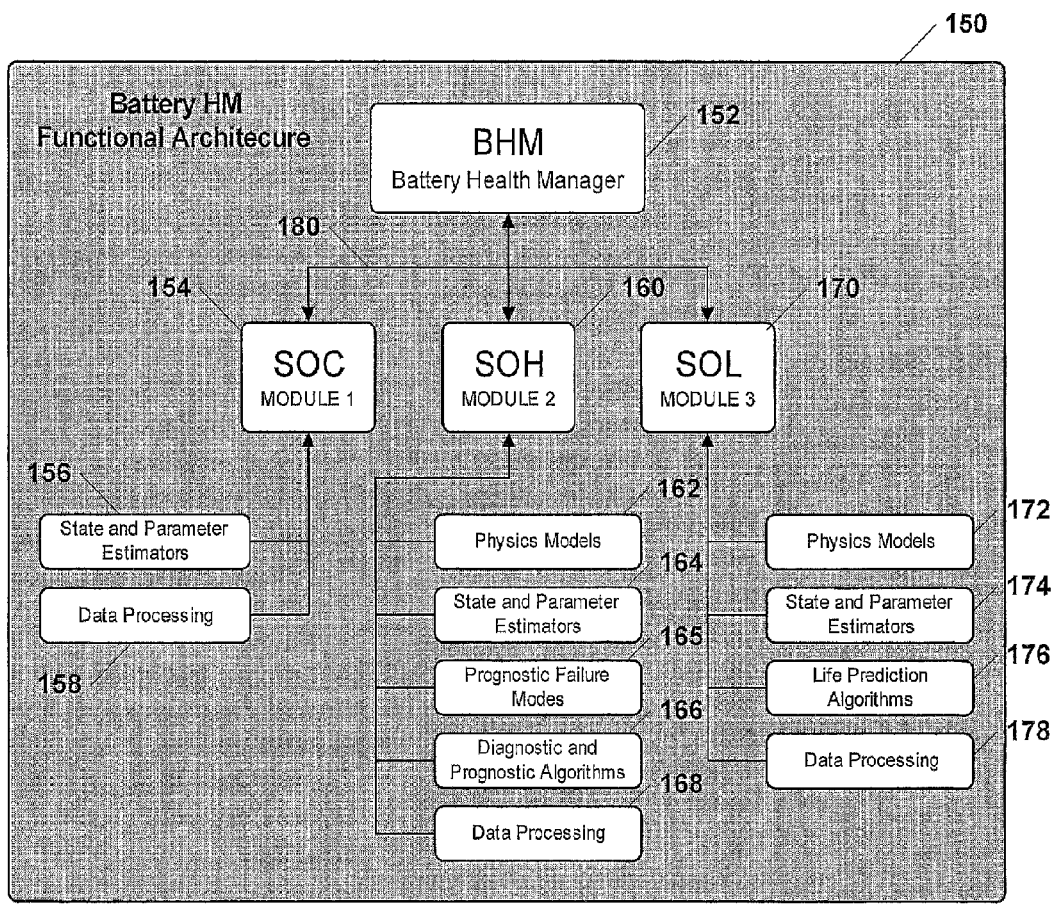
FIG. 2 is a functional architecture of a rechargeable battery health management unit.

FIG. 2 is a functional architecture of the rechargeable battery health management unit 150. In this embodiment, the health management unit 150 includes a manager module 152 operatively coupled to a State of Charge (SOC) module 154, a State of Health (SOH) module 160, and a State of Life (SOL) module 170 via an internal bus 180. The operational aspects of the embodiment of the health management unit 150 of FIG. 2 are described more fully below with respect to FIG. 3.

As shown in FIG. 2, the manager module 152 manages the SOC, SOH, and SOL modules 154, 160, 170 and interfaces with external systems and the prognostic/diagnostic modules 154, 160, 170 to manage various tasks, such as handling data and processing of functional outputs. The manager module 152 further acts as a liaison between an external, application-specific bus 153 (e.g., battery bus 116) and the internal bus 180, and handles data transfer and communication, including battery health status, to and from the health management unit 150. In some embodiments, the manager module 152 may also be configured to handle internal revisions, reconfigurations, upgrades, system parameters and settings of the various modules 154, 160, 170 via inputs received from, for example, a user interface or other command signal source.

The SOC module 154 estimates and provides battery State Of Charge information. As shown in FIG. 2, in this embodiment, the SOC module 154 accesses a state and parameter estimation component 156, and a processing component 158. The SOC module 154 uses the state and parameter estimation component 156 and the processing component 158 to estimate battery state of charge by processing battery state variables, such as voltage, current, and temperature. The SOC module 154 may be used to provide SOC status of the battery 110 during use of the vehicle 120 (e.g., in flight) by processing real-time battery data.

Similarly, the SOH module 160 serves as a diagnostic (or prognostic) tool to determine battery health by detecting and predicting failure modes. In the embodiment shown in FIG. 2, the SOH module 160 accesses a physics model component 162, a state and parameter estimation component 164, a prognostic failure mode component 165, a diagnostic and prognostic algorithm component 166, and a data processing component 168. The SOH module 160 uses one or more of these components 162, 164, 165, 166, 168 to combine flight data variables such as voltage, current, temperature, and charge cycle, along with model-based prognostics, embedded failure modes based on FMEA (Failure Modes and Effects Analysis) and signal processing of recorded battery-relevant flight data and aircraft operation anomalies, aircraft maintenance actions and fault history, to generate a health-based prognosis and mission reliability.

With continued reference to FIG. 2, the SOL module 170 similarly serves as a diagnostic or prognostic tool to determine remaining battery life and capacity. In this embodiment, the SOL module 170 accesses a physics component 172, a state and parameter estimation component 174, a life prediction algorithms component 176, and a data processing component 178. The SOL module 170 uses one or more of the components 172, 174, 176, 178 to predict long-term remaining operational life based on a correlation between model-based analysis and signal processing of battery-relevant data, including such factors as voltage, temperature, current, charge cycle, operating time (e.g., flight hours), shelf time, and onboard time.

Figure 3:
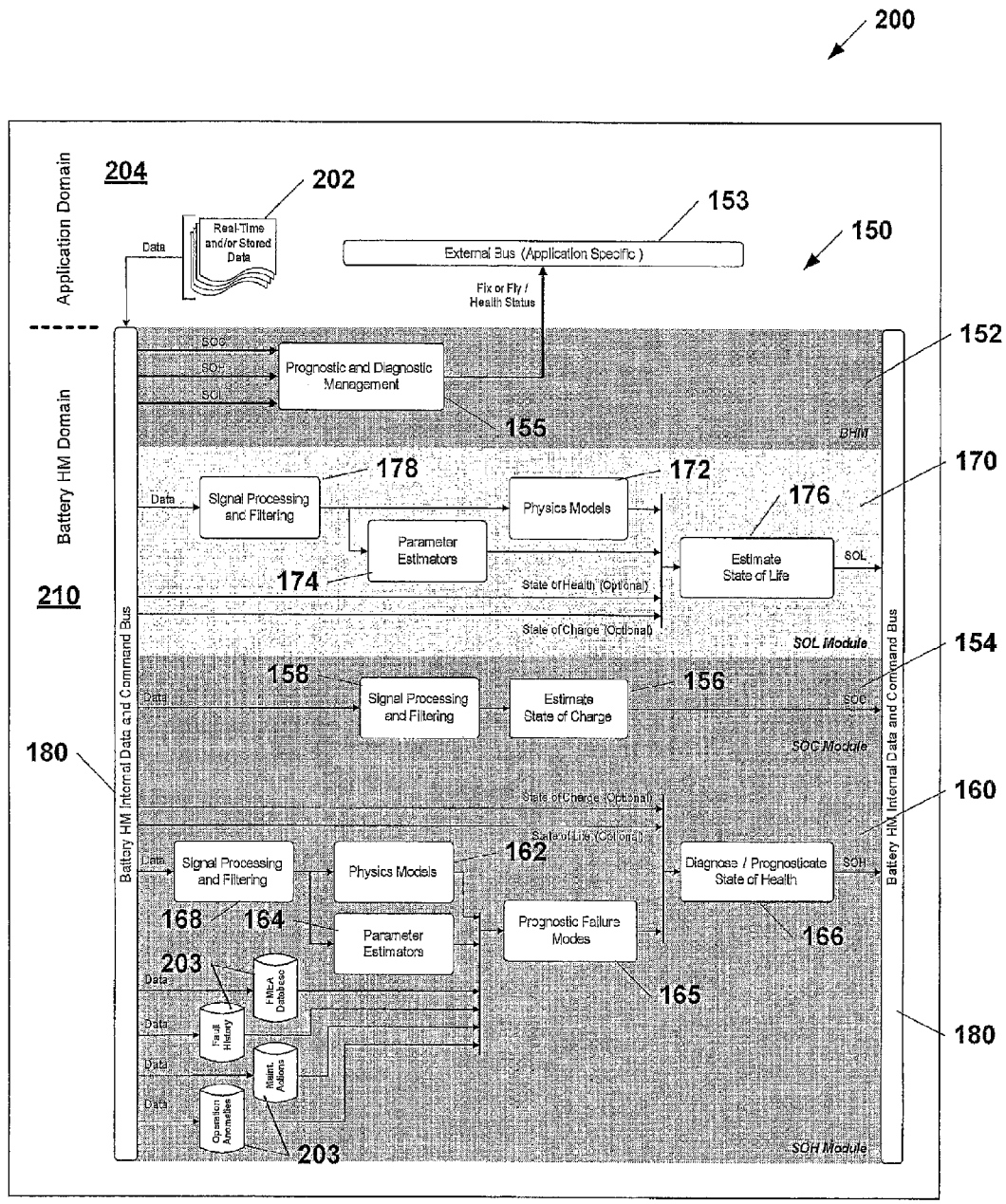
FIG. 3 is a diagram of the functional aspects of the health management unit of FIG. 2.

FIG. 3 is a diagram 200 of the functional aspects of the health management unit 150 of FIG. 2. In this embodiment, real-time or stored health management data 202 are received from an application domain 204 (e.g., an aerospace vehicle) into the internal bus 180 of the health management unit 150 within a health management domain 210. At least some of the health management data 202 are received into the SOC module 154. The SOC module 154 may perform appropriate signal processing and filtering as needed using the data processing component 158, and then estimates a State of Charge of the battery (or batteries) of the application domain 204 using the state and parameter estimation component 156. The State of Charge of the battery is placed on the internal bus 180 for access by the manager module 152.

In general, the SOC module 154 may use a variety of known charge estimation models. For example, in some embodiments, the SOC module 154 may use a charge estimation model of the type generally disclosed in the following publications, incorporated herein by reference: Characteristics of Rechargeable Batteries, C Simpson, National Semiconductor Report; Elektrotech, C. Simpson, Z, 18, p. 289, 1897; Computer modeling of the automotive energy requirements for internal combustion engine and battery electric powered vehicle, J. R. Bumby, P. H. Clarke, and I. Forster, IEEE Proceedings, Vol. 132, Pt. A. No. 5, September 1985, pp. 265-279; Reducing Battery Costs for Electric Vehicles through Optimal Depth-of-Discharge, A. T. McDonald, EVC Symposium VI Proceedings, 1981; Life Estimation of Lead-Acid Battery Cells for Utility Energy Storage, P. Symons, Proceedings of the Fifth Conference on Batteries for Utility Storage, July 1995; A Battery Life Prediction Method for Hybrid Power Applications, S.

Drouilhet and B. Johnson, AIAA Aerospace Sciences Meeting and Exhibit, 1997; and Battery Life Prediction for VRLA Batteries, D. A. Gibbs and S. Senini, Dept. of Engr. and Physical Systems, Central Queensland University.

In a particular embodiment, the rechargeable battery 110 may be a lithium ion (Li-ion) battery, and the charge estimation model used by the SOC module 154 is described with reference to Equations (1) through (5) below. More specifically, the effect of different discharge rates on battery capacity is generally described by the Peukert equation:

$$t = \frac{C_{ref}}{I^n} \tag{1}$$

where $C_{ref}$ is theoretical capacity (in Ah, equal to actual capacity at one amp), I is the current (in amps), t is time (in hours), and n is the Peukert number for the battery. The Peukert number reflects how well the battery holds up under high rates of discharge and varies from more than 1 to under 2, and a value closer to 1 is considered superior. The Peukert number is determined empirically, by testing the battery at different rates.

The Peukert equation (1) can be used to relate the capacity, C, at one discharge rate, I, to another combination of capacity and discharge rate, as follows:

$$C_i = I_i t_i = \frac{C_{ref}}{I_i^{n-1}} \tag{2}$$

$$C_j = I_j t_j = \frac{C_{ref}}{I_j^{n-1}}$$

$$\frac{C_i}{C_j} = \frac{I_i t_i}{I_j t_j} = \left(\frac{I_j}{I_i}\right)^{n-1}$$

where subscripts i and j refer to different discharge rate states.

At a constant discharge rate at state j, the State of Charge (SOC) is given by $$SOC = \frac{C_j - I_j t_j}{C_j} = 1 - \frac{I_j t_j}{C_j} \tag{3}$$

Using Equation (2), Equation (3) can also be written in terms of reference state capacity and discharge rate as follows:

$$C_j \rightarrow C_{ref} \tag{4}$$

$$I_j t_j \rightarrow I_j t_j \left(\frac{I_j}{I_{ref}}\right)^{n-1}$$

$$SOC = 1 - \frac{I_j t_j \left(\frac{I_j}{I_{ref}}\right)^{n-1}}{C_{ref}}$$

For non-constant discharge rates, the above equation is evaluated in small time steps and is given by $$SOC = 1 - \frac{\sum_{j=1}^{m} I_j t_j \left(\frac{I_j}{I_{ref}}\right)^{n-1}}{C_{ref}} \tag{5}$$

Where the inputs are the discharge rates and the corresponding time intervals $(I_j, t_j)$, j=1, . . . , n. The output is the State of Charge (SOC). $I_{ref}$ and $C_{ref}$ are obtained from the battery specification.

As further shown in FIG. 3, at least some of the health management data 202 are received into the SOL module 170, which may perform appropriate signal processing and filtering as needed using the data processing component 178. Outputs from the data processing component 178 are provided to the physics models component 172 and the parameter estimation component 174. Outputs from the physics models component 172 and the parameter estimation component 174 are provided to the life prediction algorithms component 176. As shown in FIG. 3, the SOL module 170 may receive the State of Charge estimation from the SOC component 154, and the State of Health estimation from the SOH component 160, and may use these values in the determination of the State of Life.

Figure 4:
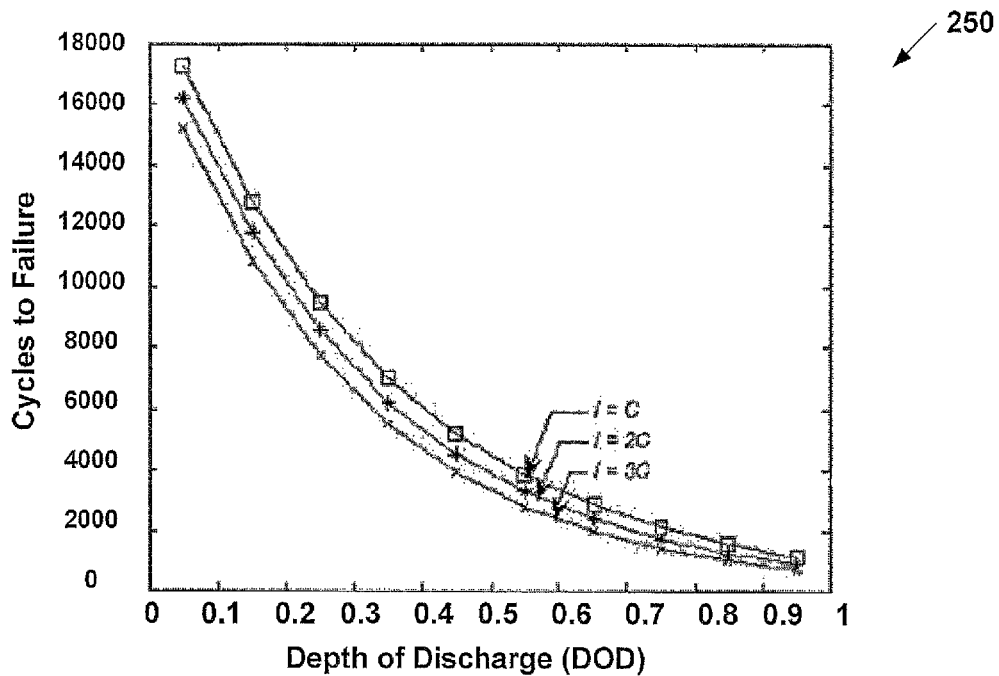
FIG. 4 is a representative graph of cycle life versus depth of discharge for three known types of rechargeable batteries.

Similarly to the SOC module 154 above, the SOL module 170 may use any suitable State of Life model, including an SOL model of the type generally disclosed in the above-referenced publications. In a particular embodiment, the SOL module 170 estimates State of Life is described with reference to Equations (6) through (16) below. More specifically, battery cycle life varies with depth of discharge (DOD). FIG. 4 is a graph 250 of cycle life versus depth of discharge for three known types of rechargeable batteries: Lead-Acid, Ni-Dc, and Ni-MH batteries. Based on empirical data of the type shown in FIG. 4, a curve fit of the data for a given discharge rate may be expressed as follows:

$$CYL_{DOD} = CYL_0 \cdot e^{\alpha - DOD} \tag{6}$$

where: $CYL_{DOD}$ equals a number of cycles to failure at depth of discharge (DOD), $CYL_0$ equals a number of cycles to failure at DOD=0 obtained by extrapolating the cycle life, and α is a slope of plot of natural logarithm of $CYL_{DOD}/CYL_0$ versus DOD.

If CYL is the actual number of charge/discharge cycle counts recorded in the vehicle at the set depth of discharge, DOD, then the State of Life, SOL, is given by $$SOL = CYL_{DOD} - CYL \tag{7}$$

Battery specification data, provided by the manufacturer, usually specifies battery life data as cycles to failure versus depth of discharge, where all discharge cycles are assumed to be under conditions of constant temperature, current $(I_R)$, and depth of discharge $(D_R)$. Actual operating conditions of the battery are usually very different from that specified in the specification. Battery lifetime estimation under actual operating conditions using the battery specification data directly may lead to errors resulting in early battery failure. In spite of this, a majority of prior art battery life estimation algorithms consider only the effect of depth of discharge on cycle life.

An alternate embodiment of a battery life prediction method may take into account the effects of varying depths of discharge and varying rates of discharge on battery life. A significant feature of the model is that it is developed using the battery performance and cycle life data provided by the manufacturer and a limited amount of empirical test data, thus eliminating the need for an electro-chemical model of the battery.

More specifically, each cell has a finite life as measured by the sum of the effective amp-hours throughput during its useful life. When the cumulative effective amp-hours throughput (the total individual effective amp-hours corresponding to a series of discharge "events") equals the rated charge life throughput of the cell, the cell will have reached its useful life. The rated charge life of the cell (in amp-hours) is defined as $$\Gamma_R = L_R D_R C_R \quad (8)$$

and similarly the actual effective charge life of the cell is given by $$\Gamma_A = L_A D_A C_A \quad (9)$$

where $C_R$=manufacturer specified rated charge capacity (Ah) at rated discharge current $I_R$, $D_R$=depth of discharge (fraction) at which rated cycle was determined, $L_R$=manufacturer specified cycle life (number of cycles to failure) at rated depth of discharge $D_R$ and discharge current $I_R$, $\Gamma_R$=is the amp-hour capacity of a cell under repeated discharges of rated $D_R$ and rated $I_R$, $C_A$=actual charge capacity (Ah) of the cell at a given discharge current $I_A$, $D_A$=actual depth of discharge (fraction), $L_A$=cycle life for a given depth of discharge $D_A$ and discharge current $I_A$, $\Gamma_A$=charge life (Ah) of a cell under actual operating conditions.

The battery may be assumed to have reached its useful life if $$\Gamma_A \geq \Gamma_R \quad (10)$$

The cell's rated capacity ($C_R$), depth of discharge ($D_R$) and cycle life ($L_R$) are typically quoted on battery specification sheets, and are otherwise readily available from the battery manufacturer. The product of these values provides the total amp-hour throughput of the battery as shown in Equation (8). The steps involved in determining the actual amp-hour capacity of the cell ($C_A$), the actual cycle life ($L_A$), and the actual depth of discharge ($D_A$) from the battery manufacturer provided data and the recorded power usage during one discharge cycle for evaluating Equation (9) are described below.

Figure 5:
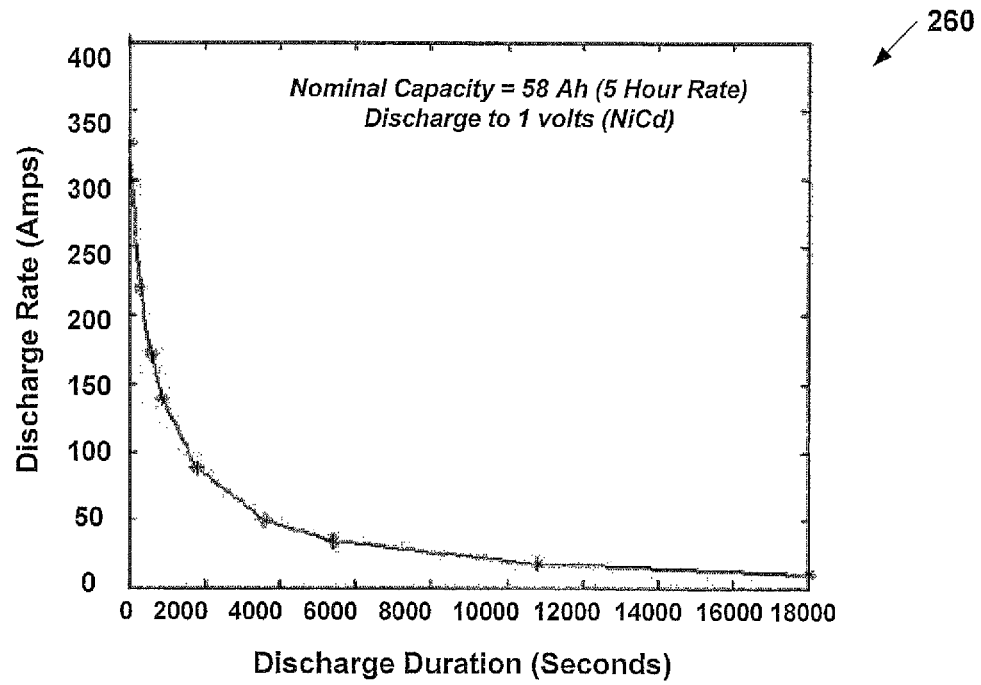
FIG. 5 is a representative graph of amperes-on-discharge data that may be provided by a battery manufacturer.
Figure 6:
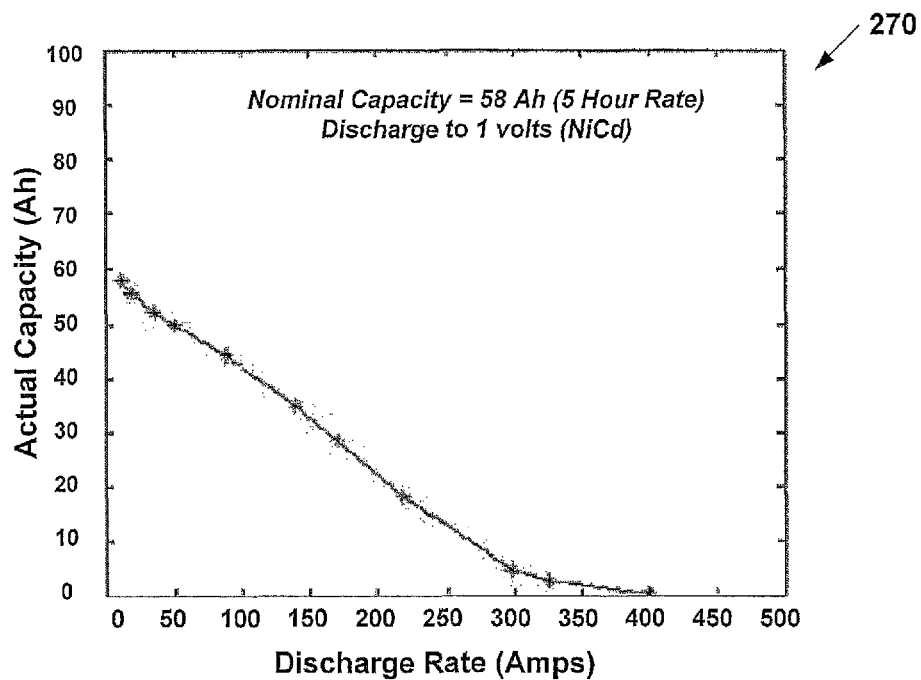
FIG. 6 is a representative graph of actual capacity versus discharge current.
Figure 7:
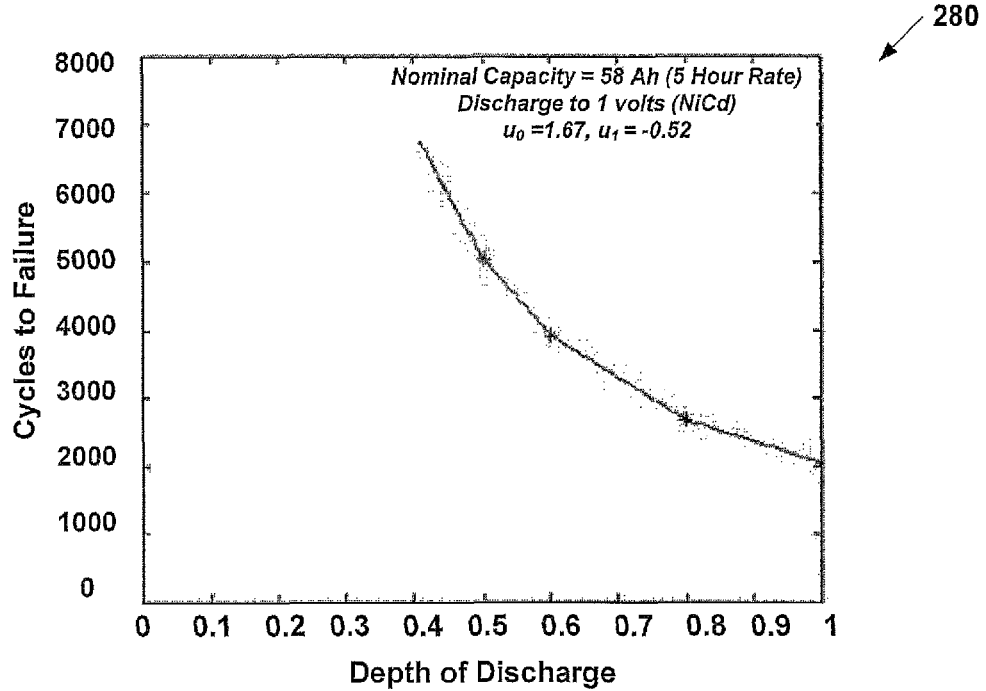
FIG. 7 is a representative graph of cycles to failure versus depth of discharge.
Figure 8:
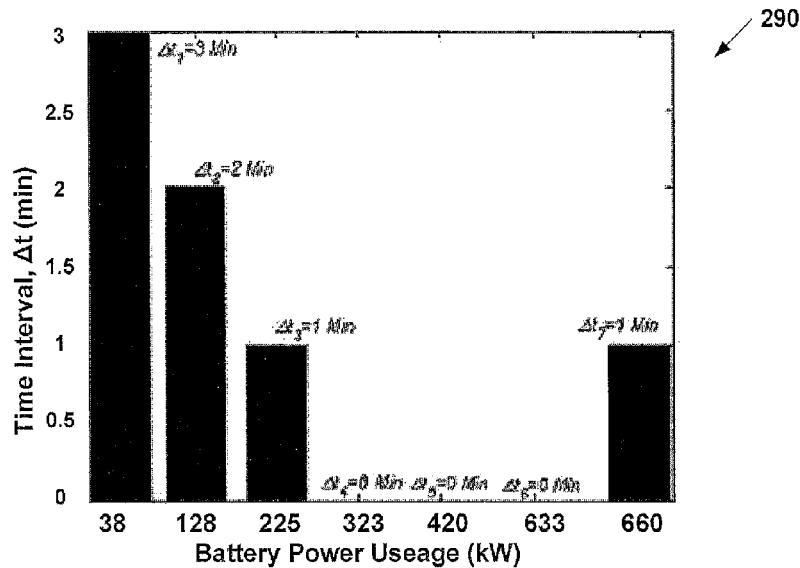
FIG. 8 is a representative graph of time interval versus battery power usage.

The actual amp-hour capacity of the cell ($C_A$) may be determined given the actual discharge current $I_A$ and the battery data provided by a manufacturer. FIG. 5 is a graph 260 of representative amperes-on-discharge data that may be provided by a battery manufacturer. The actual charge capacity of a given cell at a given discharge rate is the product of the current and the corresponding discharge duration. From the battery discharge rate data (FIG. 5), one can obtain capacity versus current curves as shown in FIG. 6 (graph 270). To determine $C_A$ for a given cell size, one may interpolate along a plot of actual capacity versus discharge current using the actual discharge current $I_A$.

The actual amp-hour capacity of the cell ($C_A$) may be determined given the actual discharge current $I_A$ and the battery data provided by a manufacturer. FIG. 5 is a graph 260 of representative amperes-on-discharge data that may be provided by a battery manufacturer. The actual charge capacity of a given cell at a given discharge rate is the product of the current and the corresponding discharge duration. From the battery discharge rate data (FIG. 5), one can obtain capacity versus current curves as shown in FIG. 6 (graph 270). To determine $C_A$ for a given cell size, one may interpolate along a plot of actual capacity versus discharge current using the actual discharge current $I_A$.

Next, the actual cycle life ($L_A$) may be determined given the actual depth of discharge ($D_A$). If the cycle versus depth-of-discharge data is provided by the manufacturer, then a curve fit of the data using the following expression may be performed and used to determine actual cycle life:

$$L_A = L_R \left(\frac{D_R}{D_A}\right)^{u_0} e^{u_1\left(1-\frac{D_A}{D_R}\right)} \quad (11)$$

where $u_0$ and $u_1$ are best fit parameters. An example of the cycle life data and the curve fit are shown in the graph 280 of FIG. 7.

Next, the actual discharge current $I_A$ may be determined. An example of a battery power usage pattern during a discharge is shown in graph 290 of FIG. 8. The total power and the total amp-hours are calculated using the following expressions $$P_{Tot} = \frac{\sum_{i=1}^{n} P_i \Delta t_i}{60} \quad (12)$$

$$C = \frac{P_{tot}(1000)(1\,\text{hr})}{V} \quad (13)$$

where V is the nominal battery voltage. The average current $\bar{I}_A$ is determined from $$\bar{I}_A = \frac{C(60)}{\sum_{i=1}^{n} \Delta t_i} \quad (14)$$

Knowing $\bar{I}_A$, $C_A$ is determined as described above. If $D_A$ is not specified, it may be estimated as follows:

$$D_A = \frac{\bar{I}_A \sum_{i=1}^{n} \Delta t_i}{C_A} \quad (15)$$

Knowing $D_A$, $L_A$ is determined as described above with reference to Equation (11). The SOL is given by $$SOL = L_A - CYL \quad (16)$$

where CYL is the actual number of cycles recorded in the vehicle (or platform).

Referring again to FIG. 3, at least some of the health management data 202 are received into the SOH module 160. The SOH module 160 will predict failure modes and will estimate the severity and the effects of the failure modes. The SOH module 160 may perform appropriate signal processing and filtering as needed using the data processing component 168, and may provide appropriate inputs to the physics models component 162 and the parameter estimation component 164. Outputs from the physics models component 162 and the parameter estimation component 164, along with one or more additional portions 203 of the health management data 202 from the application domain 204, are provided to the prognostic failure modes component 165. The diagnostic and prognostic algorithms component 166 then receives the output from the prognostic failure modes component 165, and uses this information to estimate a State of Health of the battery (or batteries) within the application domain 204. As shown in FIG. 3, the SOH module 160 may receive the State of Charge estimation from the SOC component 154, and the State of Life estimation from the SOL component 170, and may use these values in the determination of the State of Health. It will be appreciated that the SOH module 160 may use any suitable model for SOH estimation.

Typical inputs from the health management data 202 received from the application domain 202 and used by the modules 152, 154, 160, 170 of at least some embodiments of the health management unit 150 are provided below in Table 1. The State of Charge estimation, the State of Life estimation, and the State of Health estimation are output to the internal bus 180 by the SOC, SOH, and SOL modules 154, 160, 170, respectively. A prognostic and diagnostic management component 155 of the manager module 152 receives these estimations and outputs them from the manager module 152 to the application specific bus 153 of the application domain 204.

It will be appreciated that a variety of alternate embodiments may be conceived, and that the disclosure is not limited to the particular embodiments described above. For example, various embodiments of the disclosure may be characterized as having modular architectures that support both on-board and off-board software and hardware elements.

Figure 9:
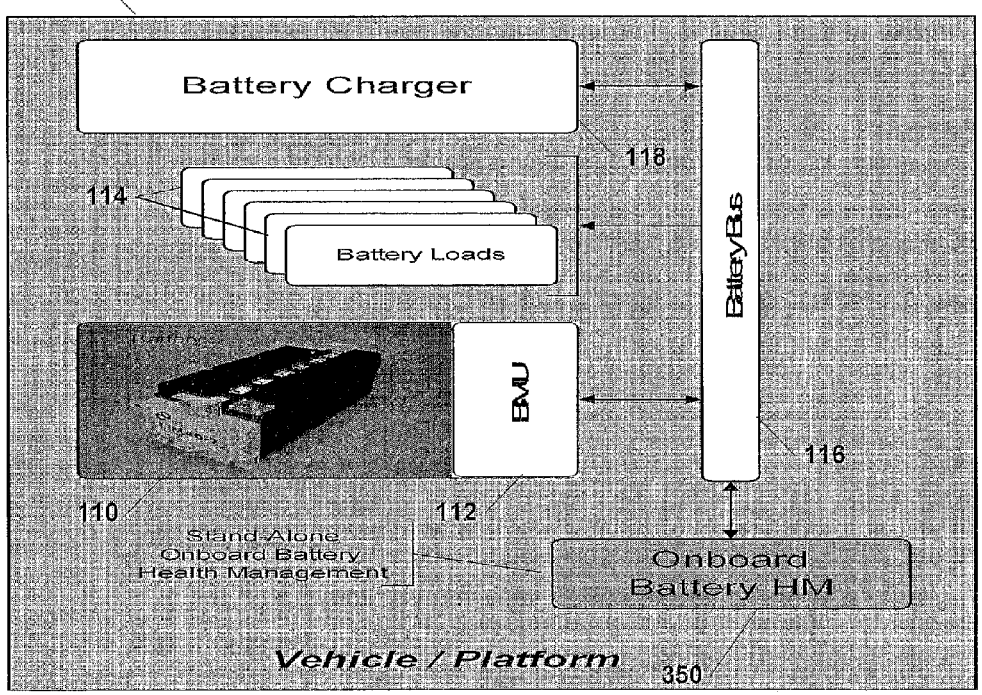
FIG. 9 is a rechargeable battery architecture having a stand alone health management unit.

More specifically, FIG. 9 is a rechargeable battery architecture 300 having a stand alone health management unit 350. Many of the components and functional aspects of the architecture 300 are similar or identical to the components described above, and for the sake of brevity, a complete description of these components will not be repeated herein. Therefore, the following descriptions of alternate embodiments will primarily focus on one or more substantially different aspects of each embodiment.

In the embodiment shown in FIG. 9, the health management unit 350 is separate from the battery monitoring unit 112 of the rechargeable battery 110. The health management unit 350 remains onboard the platform 120, and is operatively coupled to the battery bus 116. In this way, the health management unit 350 may perform the desired functions of the previously described embodiments, yet it may remain a modular component, and may be replaceable separately from the other components of the rechargeable battery architecture 300.

TABLE 1

Battery HM Functional Modules High-level I/O Requirements

| Func. Module | HM Function Description | Minimum Input Requirements | Preferred Input Requirements | Output Req. | Sampling Frequency |
|---|---|---|---|---|---|
| SOC | Estimating battery "State Of Charge" | Voltage, Current, Temperature | Voltage, Temperature, Current | SOC | Application specific: >= 1 sec |
| SOH | Estimating battery "State Of Health" and predict failure modes. Prognostics and prediction of mission reliability | Voltage, Temperature, Current, Charge Cycle, FMEA Case Database, Flight Hours | Voltage, Temperature, Current, Charge Cycle, FMEA Case Database, Fault History, Maintenance Actions, Operation Anomalies, Flight Hours, SOC, SOL | SOH | Application specific: >= 1 sec |
| SOL | Estimate remaining battery life and capacity (State of Life) | Voltage, Temperature, Current, Charge Cycle, Flight Hours | Voltage, Temperature, Current, Charge Cycle, Flight Hours, Shelf Time, Onboard Time, SOC, SOH | SOL | Application specific: >= 1 sec |
| BHM | Prognostic and Diagnostic Health Management | Application specific | SOC, SOH, SOL | Health Status: Fix or Fly | Application specific: preflight prognostics |

Embodiments of systems and methods for health management of rechargeable batteries of the disclosure may provide significant advantages over the prior art. For example, embodiments of the disclosure generally provide improved monitoring and characterization of the overall status of rechargeable batteries. In addition to providing State of Charge information using an advanced modeling technique, embodiments of the disclosure use diagnostic and prognostic reasoning algorithms to also provide State of Life and State of Health information in a real-time manner. Thus, embodiments of the disclosure may provide improved battery monitoring, characterization, control, and status determination. Embodiments of the disclosure may also increase battery safety, and may reduce unexpected battery failures and loss of capabilities, and associated costs and logistical challenges.

Figure 10:
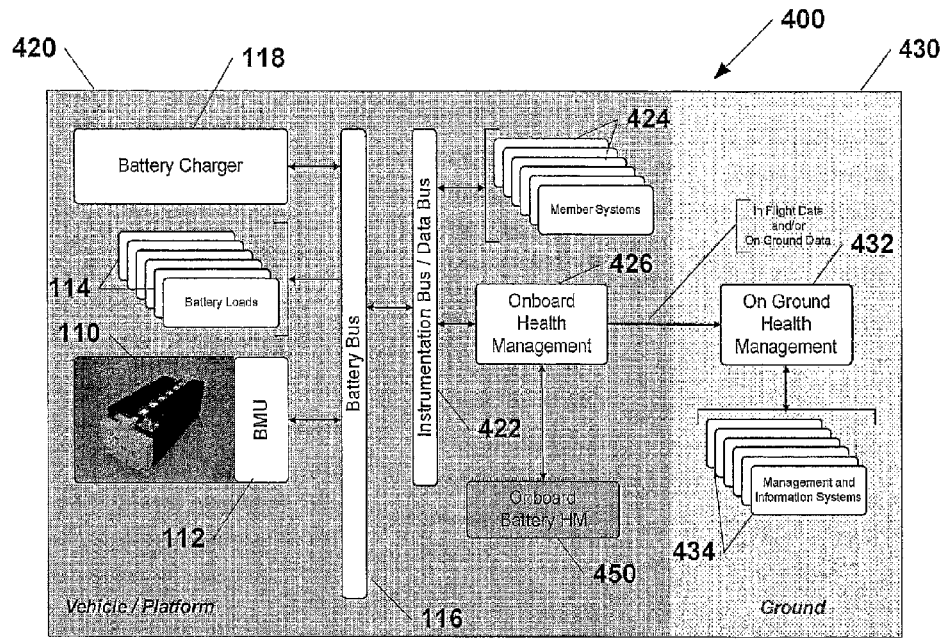
FIG. 10 is a rechargeable battery architecture having an on-board health management unit.

FIG. 10 depicts a rechargeable battery architecture 400. The architecture 400 includes a vehicle portion 420 and an off-vehicle portion 430. In alternate embodiments, the off-vehicle portion 430 may be ground-based, ship-based, aircraft-based, space-based, or any other suitable off-vehicle based concept. The off-vehicle portion 430 includes an off-vehicle health management system 432 operatively coupled to a plurality of off-vehicle information and management systems 434.

As further shown in FIG. 10, the vehicle portion 420 includes the rechargeable battery 110 coupled to the battery loads 114 and to the charger 118 via the battery bus 116, as described above. An instrumentation bus 422 is coupled to the battery bus 116, and a plurality of member systems 424 are coupled to the instrumentation bus 422. The members systems 424 may be any type of on-vehicle systems that receive power from the rechargeable battery 110 or that provide data to the instrumentation bus 422.

An onboard health management system 426 is coupled to the instrumentation bus 422 and monitors the health status of the various components of the vehicle portion 420 of the architecture 400, including the member systems 424. A battery health management unit 450 is coupled to the vehicle health management system 426, and monitors and determines the health status of the rechargeable batteries 110 as described above. The battery health management unit 450 may communicate the status of the rechargeable battery 110 (e.g., SOC, SOL, and SOH) to the vehicle health management system 426, which in turn communicates with the off-vehicle health management system 432.

Figure 11:
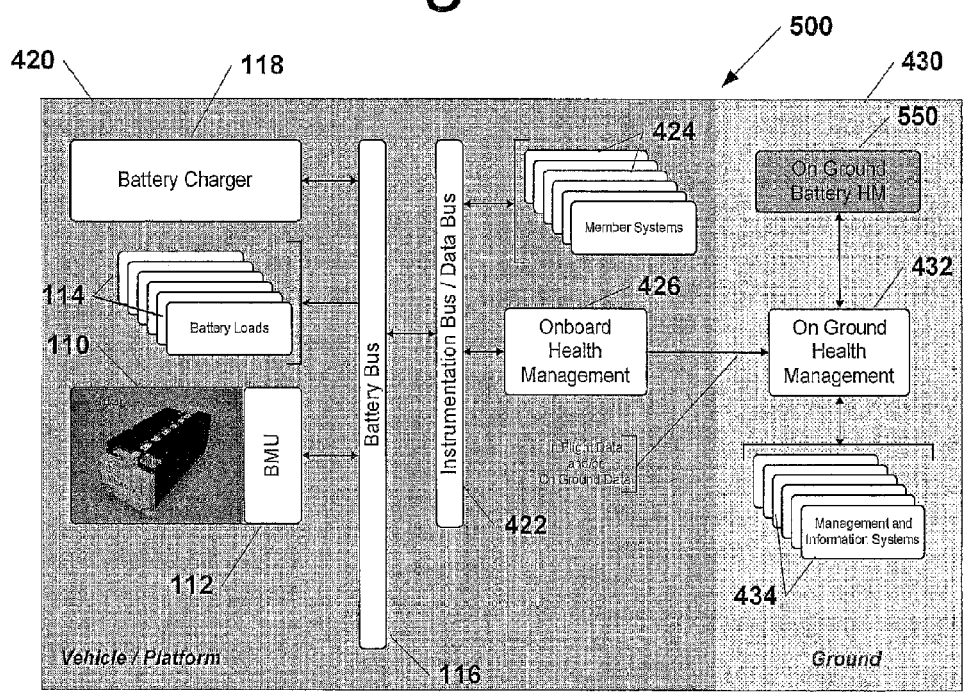
FIG. 11 is a rechargeable battery architecture having an on-ground health management unit.

Similarly, FIG. 11 depicts a rechargeable battery architecture 500. The architecture 500 includes the vehicle portion 420 and the off-vehicle portion 430, however, in this embodiment, the off-vehicle portion 430 includes an off-vehicle battery health management unit 550 operatively coupled to the off-vehicle health management system 432. The off-vehicle battery health management unit 550 receives inputs from the rechargeable battery 110 (and possibly other data sources) via the battery bus 116, the instrumentation bus 422, the vehicle health management system 426, and the off-vehicle health management system 432 to determine the status of the rechargeable battery 110.

Figure 12:
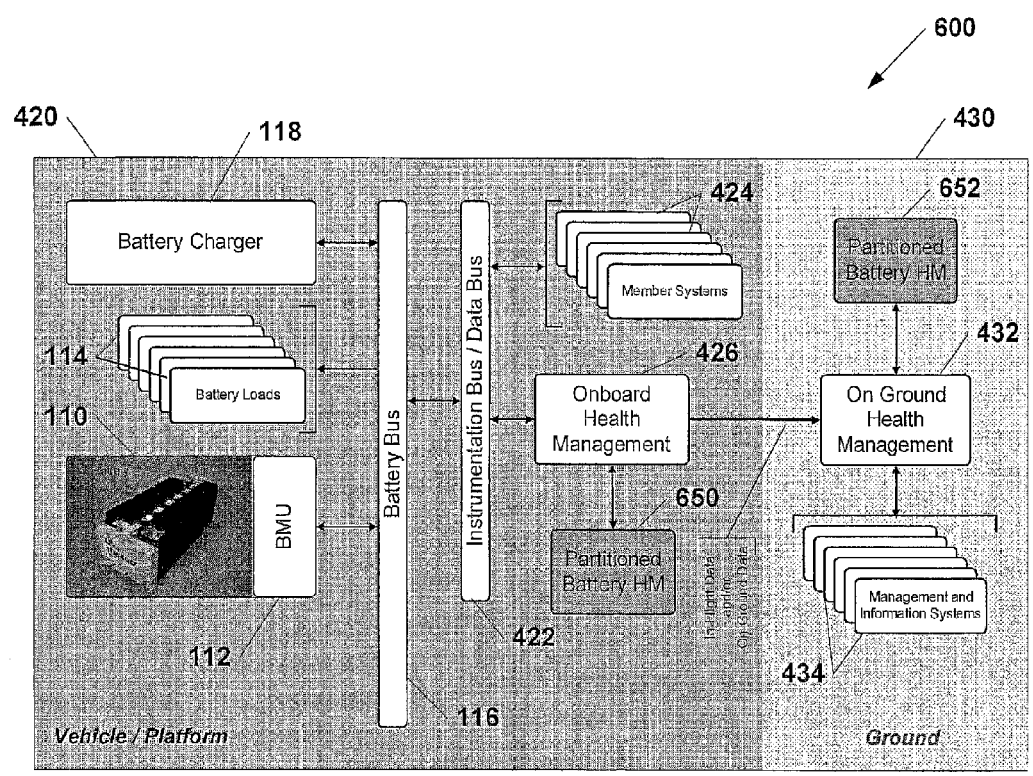
FIG. 12 is a rechargeable battery architecture having a partitioned health management unit.

In further embodiments, the battery health management functions may be partitioned or distributed between on-vehicle functions and off-vehicle functions. For example, FIG. 12 is a rechargeable battery architecture 600 having an on-vehicle battery health management portion 650 and an off-vehicle battery health management portion 652. The on-vehicle battery health management portion 650 is disposed on the vehicle portion 420 and coupled to the vehicle health management system 426. The off-vehicle battery health management portion 652 is disposed on the off-vehicle portion 430 and is coupled to the off-vehicle health management system 432. Thus, embodiments of the disclosure may be modular to enable some functions to be performed onboard a vehicle (or platform), while other functions may be performed off the vehicle.

Figure 13:
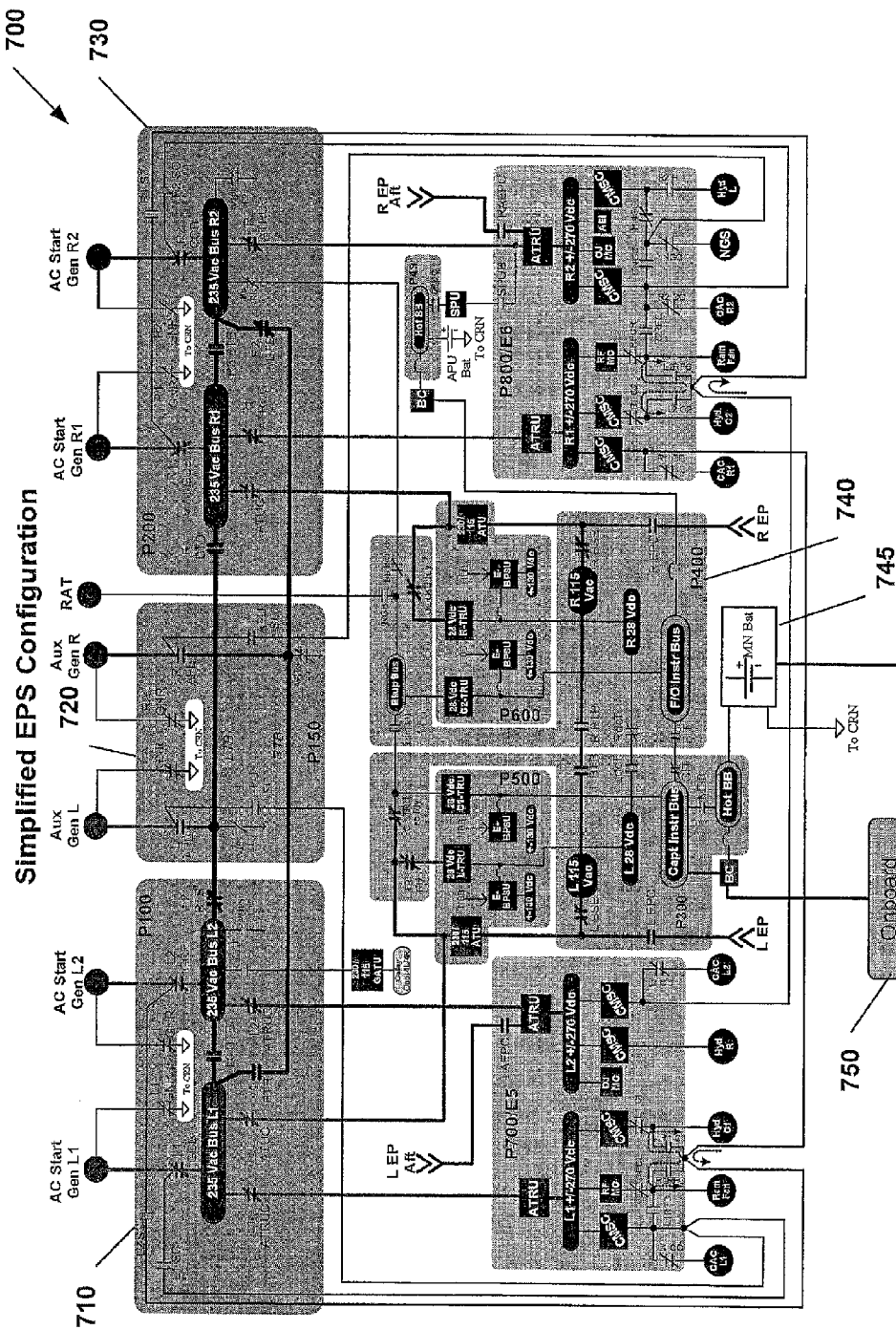
FIG. 13 is a schematic view of an electrical monitoring system for an aircraft.

As noted above, embodiments of the disclosure may be used in a variety of applications, including vehicles (e.g., aircraft, UAV, automobiles, golf carts, personal conveyances), moveable or stationary equipment having one or more rechargeable batteries, or any other suitable platforms having rechargeable batteries. For example, FIG. 13 is a schematic view of an electrical monitoring system 700 for an aircraft. In this embodiment, the electrical monitoring system 700 includes a first alternating current (AC) start module 710, an auxiliary module 720, and a second AC start module 730, operatively coupled to a master health monitoring module 740. An onboard battery health management unit 750 is coupled to a rechargeable battery 745 and to the master health monitoring module 740. The onboard battery health management unit 750 performs one or more of the desired monitoring, prognostic, and diagnostic functions described above, and provides the desired information on the health status of the rechargeable battery 745 to the master health monitoring module 740. In turn, this health status information may be provided to the flight crew, maintenance crew, or other aircraft-related personnel, or to suitable off-vehicle status monitoring systems.

Figure 14:
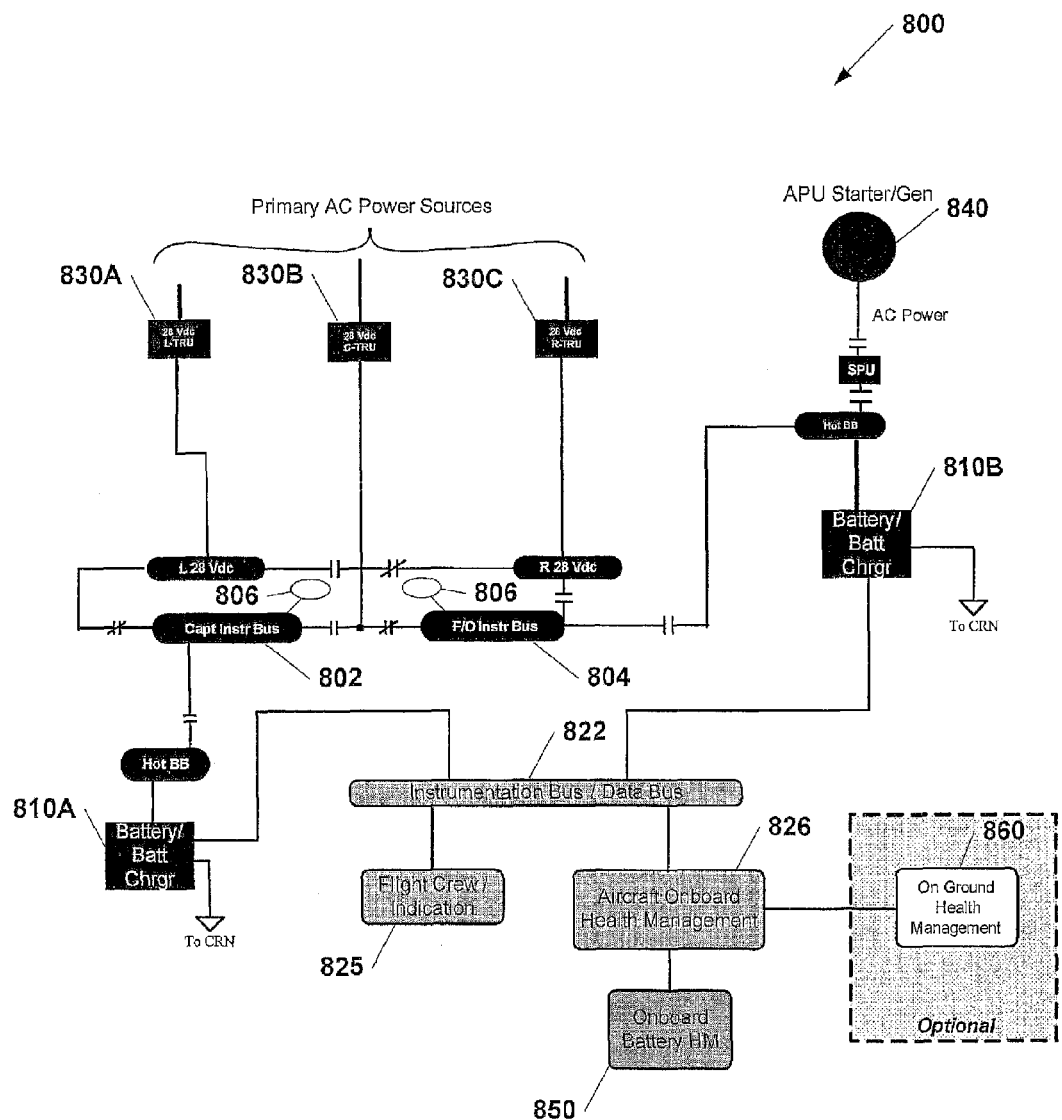
FIG. 14 is an onboard rechargeable battery system.

FIG. 14 is a schematic view of an electrical system 800 for an aircraft. In this embodiment, a pair of battery and charger assemblies 810 are coupled to a data bus 822. Each of the battery and charger assemblies 810 may include a battery portion, and a charger portion configured to recharge the battery portion. A plurality of primary power sources 830, and an auxiliary power unit (APU) 840, are operatively coupled to the battery and charger assemblies 810 and may provide the power necessary to recharge the battery and charger assemblies 810. In this embodiment, a captain's instrumentation bus 802 and a first officer's instrumentation bus 804 are coupled to the primary power sources 830, the APU 840, and the battery and charger assemblies 810, and may be coupled to one or more instrumentation displays (e.g., cockpit displays) 806 to enable the status of these components to be displayed to the captain and first officer.

The electrical system 800 further includes a vehicle health monitoring system 826 coupled to the data bus 822, and a battery health monitoring unit 850 coupled to the vehicle health monitoring system 826. An indicator 825 is coupled to the data bus 822 and may provide an indication (e.g., digital or analog) of the health status of the battery and charger assemblies 810, and of any of the other monitored components of the electrical system 800. In some embodiments, the indicator 825 is a display that provides health status information to the flight crew. The system 800 may further include an off-vehicle monitoring portion 860. In this embodiment, the off-vehicle monitoring portion 860 is coupled to the vehicle health monitoring system 826. Therefore, the above-noted advantages of improved battery monitoring, characterization, control, and status determination may be achieved in various embodiments of electrical power systems for aircraft and other suitable vehicles, platforms, and power system applications.

The electrical system 800 may be suitable for a wide variety of aircraft where onboard and/or on-ground components may be desired to provide SOC, SOL and SOH of the onboard battery or batteries. Embodiments of the disclosure may be used for energy storage components of numerous aircraft subsystems and applications, including Main and APU Battery/Battery charger system, Flight Control Electronics, Emergency Lighting System, and Recorder Independent Power Supply.

Typically, a Main and APU Battery/Battery charger system utilizes two batteries. The battery includes a battery monitoring unit (BMU) incorporating redundant circuits that balance cell voltages, charging, and make the battery BITE and failure annunciation to the flight crew. The protection circuits protect for overcharge, over-discharge, overheating, and cell balancing. The battery system may support all hot battery bus loads, may support emergency loads when no AC power is available, on-ground towing loads, and APU starts.

Similarly, Flight Control Electronics (FCE) may utilize two batteries (e.g., Li-Ion 10 minute batteries) which provide backup to the primary power (e.g. Permanent Magnet Generators) and secondary power (e.g., airplane main 28 VDC). Each FCE battery may have a dedicated BMU external to the battery to prevent cell imbalance, over or under charging, and to maintain safe temperature control.

A typical Wireless Emergency Lighting System (WELS) may use battery packs to provide passenger emergency lighting after loss of airplane power. The battery pack may have the charging and monitoring circuitry in the WELS Control Unit (WCU) that houses the battery pack.

Also, a Recorder Independent Power Supply (RIPS) may contain energy storage and interface circuitry to maintain operation of the recorder and area microphone for a desired period of time (e.g., 10 minutes) after loss of airplane power.

The dedicated BMUs for the systems above may provide battery voltage, output current, temperature and charging information to the battery health management module 850 which will further provide diagnosis and prognosis in terms of SOC, SOL (remaining battery life and battery capacity) and SOH (Health: detecting, predicting and isolating different failure modes). The battery health management module 850 may also provide battery health management data to the flight crew (e.g., indication/annunciation) and to the maintenance crew.

Figure 15:
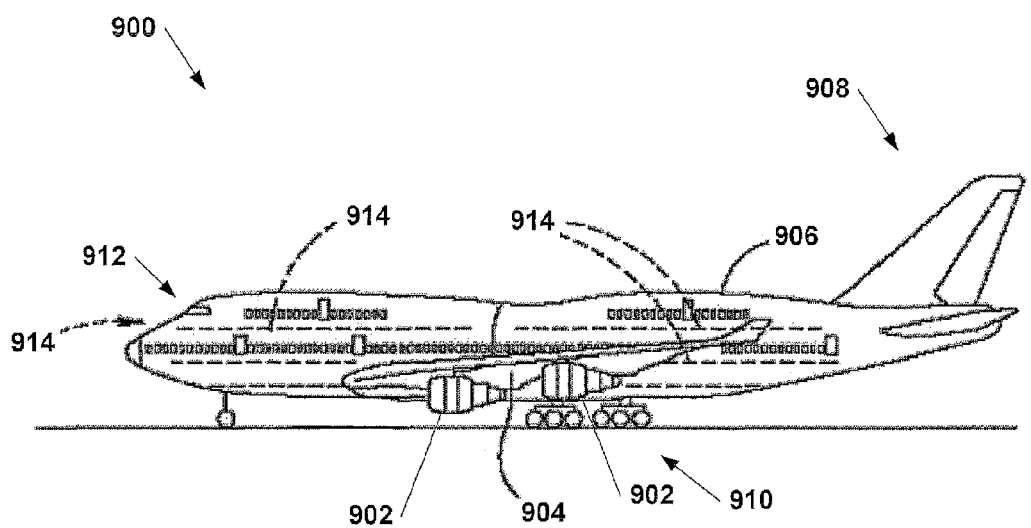
FIG. 15 is a side elevation view of an aircraft.

FIG. 15 is a side elevation view of an aircraft 900. The aircraft 900 includes a variety of components and systems that are generally known in the art, including one or more propulsion units 902, a pair of wing assemblies 904 (one visible) extending outwardly from a fuselage 906, a tail assembly 908, a landing assembly 910, and a flight control system 912. The aircraft 900 includes other known systems and subsystems generally required for the proper operation of the aircraft 900.

The aircraft 900 also includes one or more rechargeable battery systems 914, which may be positioned in various locations throughout the aircraft 900. The various systems 914 may be incorporated, for example, into power distribution systems, instrumentations systems, communication systems, navigation systems, control systems, actuation systems, lighting systems, or any other suitable systems or components of the aircraft 900.

Although the aircraft 900 shown in FIG. 15 is generally representative of a passenger aircraft, such as a model 737, 747, 757, 767, 777, or 787 aircraft available from The Boeing Company of Chicago, Ill., it will be appreciated that in alternate embodiments, any other type of aircraft may be equipped with embodiments of the systems and methods in accordance with the present disclosure. For example, in alternate embodiments, systems and methods for health management of rechargeable batteries may also be incorporated into other types of aerospace vehicles, including military aircraft, rotary wing aircraft, UAV's, missiles, post-boost vehicles, spacecraft, and any other suitable types of vehicles and platforms, as illustrated more fully in various reference texts, such as Jane's All The World's Aircraft available from Jane's Information Group, Ltd. of Coulsdon, Surrey, UK.

As described above, embodiments of methods and systems in accordance with the present disclosure are modular by design and can be implemented in virtually any rechargeable battery application. Therefore, embodiments of modular and configurable architectures provide optimized application-specific battery health management solutions in terms of integration, time, cost, weight, size and power, for virtually any rechargeable battery application.

Embodiments of systems and methods in accordance with the present disclosure may also meet U.S. Federal Aviation Administration requirements as set forth in 14 CFR Part 25.1353(c)(1) through (c)(4). The internal battery circuits may continuously monitor operating parameters during charge operation. Implementation of battery health management as described in this disclosure may provide a robust battery installation design that meets an improbable failure rate. In addition, since embodiments of the disclosure may provide prognostic and diagnostic capabilities, unscheduled interrupts due to unexpected battery failures may be reduced or minimized, thus resulting in significant reduction in operational and maintenance costs. Cost/benefit analyses indicate significant advantages resulting from implementation of embodiments of the present disclosure. More efficient fleet management and improved asset availability may also be realized, as embodiments of the disclosure may lead to reduced unscheduled interrupts and related down time resulting in significant reduction in operational and maintenance costs, and may also provide increased mission reliability and asset management as a result of reliable battery health and capability assessment.

While preferred and alternate embodiments of the disclosure have been illustrated and described, as noted above, many changes can be made without departing from the spirit and scope of the disclosure. Accordingly, the scope of the disclosure is not limited by the description of the embodiments. Instead, the scope of disclosure should be determined entirely by reference to the claims that follow.

What is claimed is:

1. A vehicle comprising:
    a body comprising an aircraft fuselage;
    a propulsion unit operatively coupled to the body, the propulsion unit comprising an aircraft engine; and
    an electrical power system at least partially disposed within the body, the electrical power system including:
        a rechargeable battery;
        a battery health management unit operatively coupled to the rechargeable battery, the battery health management unit including a state of health module configured to receive battery-related data and to output health information and battery failure information, wherein the battery-related data includes data collected in real time operation of the rechargeable battery and battery relevant fault history of the vehicle;
        a battery bus coupled to the rechargeable battery and to the battery health management unit;
        at least one AC source operatively coupled to the battery bus;
        a recharger coupled to the battery bus;
        at least one electrical load coupled to the battery bus; and
        an indicator operatively coupled to the battery bus and configured to convey at least a portion of the health information to an operator.

2. The vehicle of claim 1, wherein the battery health management unit includes a state of life module operatively coupled to the rechargeable battery, and wherein the state of life module is configured to determine a remaining battery life.

3. The vehicle of claim 1, wherein the battery health management unit includes a state of charge module operatively coupled to the rechargeable battery, wherein the state of charge module is configured to determine a remaining battery capacity based on a discharge rate, a reference capacity, and a reference discharge rate.

4. The vehicle of claim 1, wherein the health information includes effects on the electrical power system from a battery failure of the rechargeable battery.

5. The vehicle of claim 1, wherein the battery failure information includes a predicted mode of failure.

6. The vehicle of claim 1, wherein the health information includes a predicted number of cycles until a battery failure of the rechargeable battery occurs.

7. The vehicle of claim 2, wherein the state of health module receives an output from the state of life module, and wherein the health information determined by the state of health module is based on the output.

8. The vehicle of claim 2, wherein the state of life module receives an output from the state of health module and wherein the remaining battery life determined by the state of life module is based on the output.

9. The vehicle of claim 2, wherein the battery health management unit includes a state of charge module operatively coupled to the rechargeable battery, and wherein the remaining battery life determined by the state of life module is based on an output of the state of charge module.

10. The vehicle of claim 3, wherein the state of health module receives an output from the state of charge module, and wherein the health information determined by the state of health module is based on the output.

11. A vehicle comprising:
a body comprising an aircraft fuselage;
a propulsion unit operatively coupled to the body, the propulsion unit comprising an aircraft engine; and
an electrical power system at least partially disposed within the body, the electrical power system including:
a rechargeable battery;
a battery health management unit operatively coupled to the rechargeable battery and including a state of health module configured to receive battery-related data and to output health information and battery failure information, wherein the battery-related data includes data collected in real time operation of the rechargeable battery and a battery relevant operation anomaly associated with the vehicle;
a battery bus coupled to the rechargeable battery and to the battery health management unit;
at least one AC source operatively coupled to the battery bus;
a recharger coupled to the battery bus;
at least one electrical load coupled to the battery bus; and
an indicator operatively coupled to the battery bus and configured to convey at least a portion of the health information to an operator.

12. The vehicle of claim 11, wherein the battery health management unit includes a state of life module operatively coupled to the rechargeable battery, and wherein the state of life module is configured to determine a remaining battery life.

13. The vehicle of claim 11, wherein the battery health management unit includes a state of charge module operatively coupled to the rechargeable battery, wherein the state of charge module is configured to determine a remaining battery capacity based on a discharge rate, a reference capacity, and a reference discharge rate.

14. The vehicle of claim 11, wherein the health information includes effects on the electrical power system from a battery failure of the rechargeable battery.

15. The vehicle of claim 11, wherein the health information includes an indication of mission reliability.

16. The vehicle of claim 11, wherein the battery-related data includes maintenance history of the vehicle.

17. The vehicle of claim 12, wherein the state of health module receives an output from the state of life module, and wherein the health information determined by the state of health module is based on the output.

18. The vehicle of claim 12, wherein the state of life module receives an output from the state of health module and wherein the remaining battery life determined by the state of life module is based on the output.

19. The vehicle of claim 12, wherein the battery health management unit includes a state of charge module operatively coupled to the rechargeable battery, and wherein the remaining battery life determined by the state of life module is based on an output of the state of charge module.

20. The vehicle of claim 13, wherein the state of health module receives an output from the state of charge module, and wherein the health information determined by the state of health module is based on the output.

* * * * *